(12) United States Patent
Kim

(10) Patent No.: US 6,297,679 B1
(45) Date of Patent: Oct. 2, 2001

(54) INPUT BUFFER

(75) Inventor: Yong Ki Kim, Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/599,464

(22) Filed: Jun. 22, 2000

(30) Foreign Application Priority Data

Jun. 29, 1999 (KR) .................................. 99-25381

(51) Int. Cl.[7] .................................................. H03H 11/26
(52) U.S. Cl. .......................... 327/276; 327/407; 327/299
(58) Field of Search .............................. 327/392, 393, 327/395, 398, 401, 403, 277, 276, 407, 299

(56) References Cited

U.S. PATENT DOCUMENTS

| | | | |
|---|---|---|---|
| 4,110,639 | 8/1978 | Redwine | 326/70 |
| 5,740,410 * | 4/1998 | Mc Dermott | 395/556 |
| 5,880,998 | 3/1999 | Tanimura et al. | 365/189.05 |
| 5,986,943 | 11/1999 | Isa | 365/189.04 |
| 6,028,462 * | 2/2000 | Kyles | 327/277 |

* cited by examiner

Primary Examiner—Tuan T. Lam
Assistant Examiner—Hier Nguyen
(74) Attorney, Agent, or Firm—Nath & Associates PLLC; Gary M. Nath; Marvin C. Berkowitz

(57) ABSTRACT

The present invention discloses an input buffer which can improve the properties of a setup time and a hold time of an input signal. When the setup time is important, a path of a short delay time is employed, and when the hold time is important, a path of a long delay time is used. Therefore, the internal setup time/hold time may be suitably selected in the system application conditions. For this, the input buffer includes: a buffer for receiving a signal through an input pin; a plurality of delay units for delaying the signal inputted from the buffer by a different delay time; and a selecting unit for selectively outputting one of the output signals from the plurality of delay units according to an externally-inputted reference signal and the logic variation of the input signal from the buffer.

6 Claims, 6 Drawing Sheets

INPUT BUFFER

BACKGROUND OF THE INVENTION

The present invention relates to an input buffer, and in particular to an input buffer for buffering and outputting an inputted signal.

In general, a semiconductor integrated circuit such as a microprocessor, a dynamic random access memory (DRAM) and a synchronous random access memory (SRAM) is fabricated by providing various transistors and other manual devices to a silicon wafer.

Any semiconductor device is provided with input and output signals according to its operational object, and a power supply terminal for driving the semiconductor device is required.

The power supply terminal is connected to the power supply of the system, and normally consists of the power line VDD or VCC and the ground line VSS. The input and output signals exist in a group. The group of the input and output signals is called a bus.

A signal inputted through an external signal pin of the semiconductor device has limitations. For example, in order to be inputted through the pin, an address signal must reach to the pin within a predetermined time before the enabling of a reference signal (for example, a clock signal or control signal). The predetermined time is a setup time ts (refer to FIG. 1). In addition, an effective signal needs to be maintained for a predetermined time after the enabling of the reference signal. The predetermined time is a hold time th (refer to FIG. 1).

Referring to FIG. 1, when the input signal has a small load, the setup time ts has a good property in the case A. In this case, the input signal is operated before the effective clock, and thus a load is generated on the hold time th. On the other hand, in the case B, when the input signal is delayed for a predetermined time due to a great load, the input signal may be inputted almost simultaneously with or later than the reference clock.

As described above, the setup time ts and the hold time have contrary properties.

When the setup time ts has a superior property, the hold time th has an inferior property, and vise versa.

The application environment of the semiconductor products generally has various modifications. Especially, in processing the input signals, the setup time ts is important in some systems, and the hold time th is important in other systems.

FIG. 2 is a block diagram illustrating a structure of a general input buffer. A buffer 14 converts an input signal inputsig inputted through a pin, namely an LVTTL logic signal to a CMOS logic state, and transmits the converted signal into a delay unit 16. Thereafter, the delay unit 16 adjusts the setup/hold time according to the reference signal (clock signal CLK inputted to an internal clock generating unit 12), and transmits the signal to a switching unit 18.

When a delay time is increased in the delay unit 16, the property of the hold time th is improved. In the case that the delay time is decreased in the delay unit 16, the property of the setup time ts is improved. In general, the delay time is adjusted so that one of the setup time ts and hold time th cannot have an excessively excellent property.

An output from the delay unit 16 and an internal clock int_clk are ANDed in the switching unit 18. A resultant signal thereof decides timing of generating the effective signal of the input signal to be used in a chip.

The state where the input signal is inputted to the external pin is divided into the states where the input signal is converted from low to high and high to low according to the LVTTL logic signal.

At this time, the conversion time of the input signal (rise time and fall time) may be different. In this case, a time interval between the setup time ts and the hold time th is increased. In addition, the conditions of the operation, such as voltage and temperature may be varied. It more increases the time interval.

SUMMARY OF THE INVENTION

Accordingly, it is an object of the present invention to provide an input buffer which can improve the properties of a setup time and a hold time of an input signal.

In order to achieve the above-described object of the present invention, there is provided an input buffer including: a buffer for receiving a signal through an input pin; a plurality of delay units for delaying the signal inputted from the buffer by a different delay time; and a selecting unit for selectively outputting one of the output signals from the plurality of delay units according to an externally-inputted reference signal and the logic variation of the input signal from the buffer.

There is also provided an input buffer including: a first buffer for receiving an externally-inputted reference signal; a second buffer for receiving a signal through an input pin; a plurality of delay units for delaying the signal inputted from the second buffer by a different time; an input signal conversion detecting unit for detecting level conversion of the input signal according to the logic state of the input signal from the second buffer on the basis of the reference signal from the first buffer; a selecting unit for compensating for a setup time and a hold time of the input signal by selectively outputting one of the output signals from the plurality of delay units according to the signal from the input signal conversion detecting unit; and a switching unit for receiving a signal from the selecting unit, and outputting an effective signal of the input signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

An input buffer in accordance with a preferred embodiment of the present invention will now be described in more detail with reference to the accompanying drawings.

Figure 3:
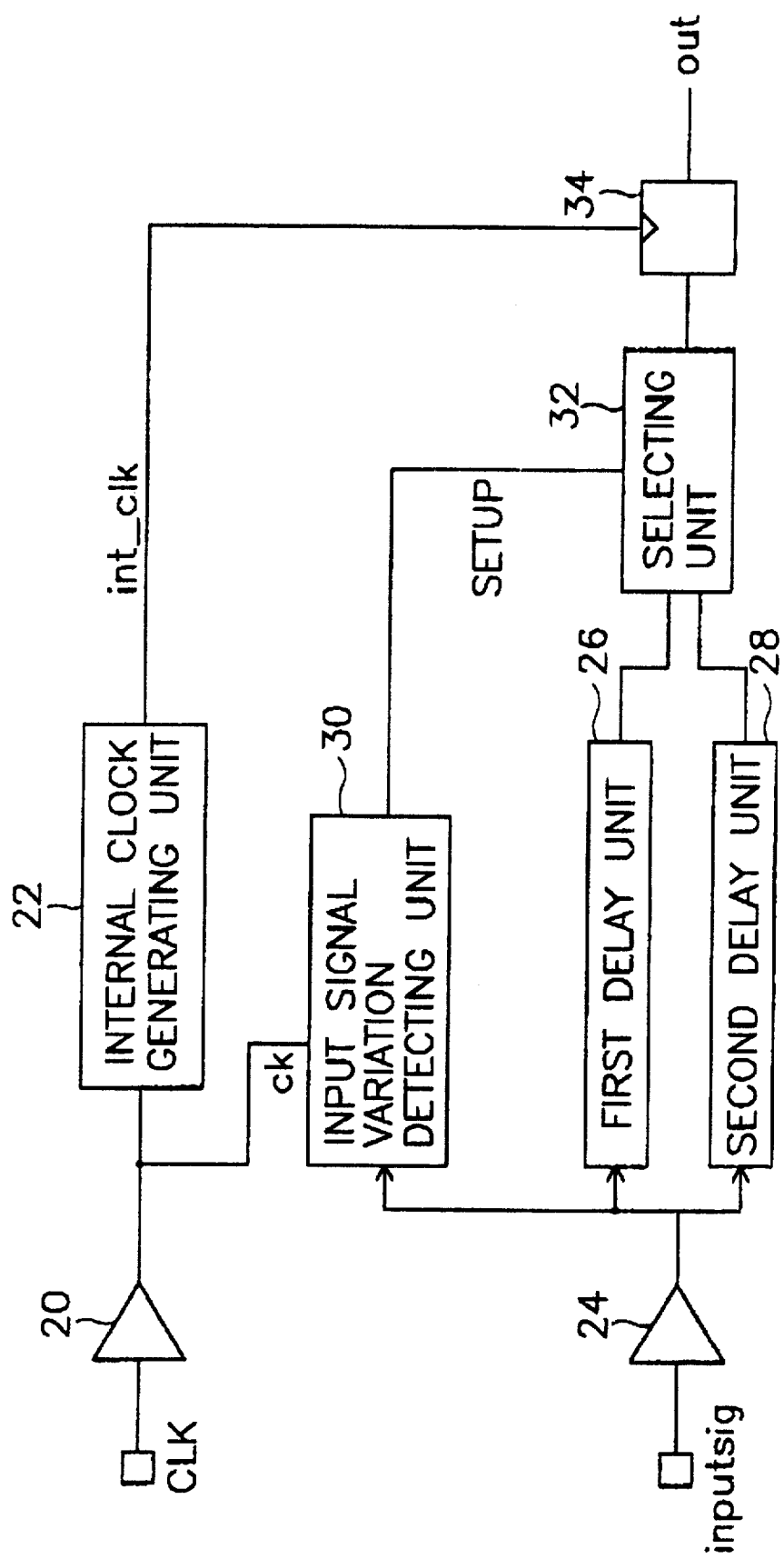
FIG. 3 is a block diagram illustrating an input buffer in accordance with a preferred embodiment of the present invention.
Figure 4:
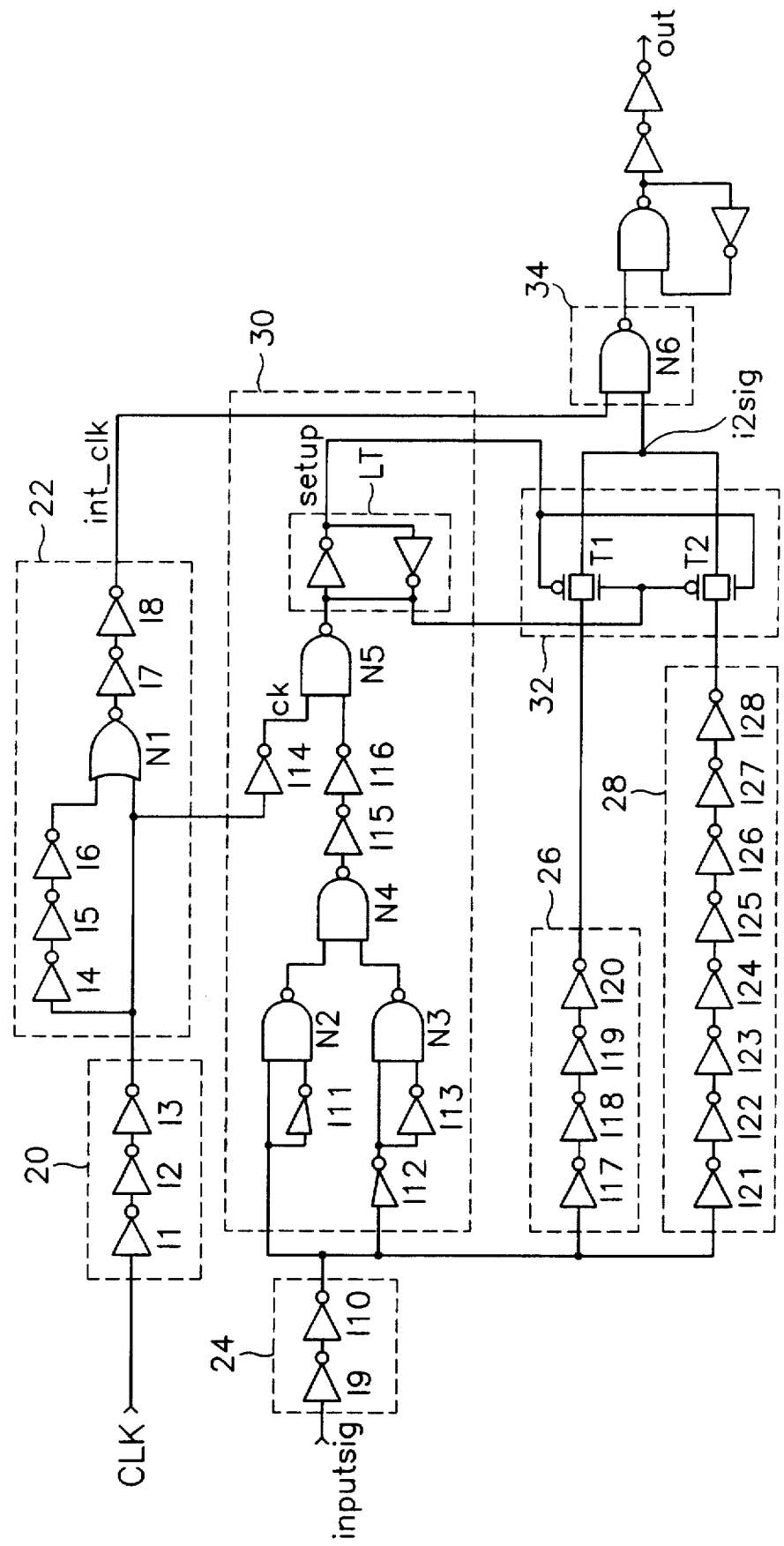
FIG. 4 is a circuit diagram illustrating the input buffer in accordance with the preferred embodiment of the present invention.

FIGS. 3 and 4 are a block diagram and a circuit diagram respectively illustrating the input buffer in accordance with the preferred embodiment of the present invention. Reference numeral 20 denotes a first buffer for buffering an inputted reference signal (a clock signal CLK in this embodiment). The first buffer 20 includes inverters I1, I2, I3 which are connected in series.

Reference numeral 22 indicates an internal clock generating unit for receiving the reference signal CLK from the first buffer 20, and generating an internal signal int_clk to be used in a corresponding input buffer. The internal signal int_clk is generated in the form of a pulse at a rise edge of the reference signal CLK.

The internal clock generating unit 22 includes: delay units I4, I5, I6 for delaying the output from the inverter I3 for a predetermined time; a NOR gate N1 for receiving and NORing the outputs from the first buffer 20 and the inverter I6; and inverters I7, I8 for delaying the output from the NOR gate N1.

Reference numeral 24 denotes a second buffer for buffering an input signal inputsig inputted through an external pin. The second buffer 24 includes inverters I9, I10 that are connected in series.

Reference numerals 26 and 28 indicate delay units for receiving the output from the second buffer 24, and delaying it for a predetermined time. The first delay unit 26 includes inverters I17, I18, I19, I20 which are connected in series, and the second delay unit 28 includes inverters I21 to I28 which are connected in series.

A delay time of the first delay unit 26 is shorter than that of the second delay unit 28.

Reference numeral 30 denotes an input signal conversion detecting unit for detecting level conversion of the input signal according to the logic variation of the input signal from the second buffer 24 on the basis of the reference signal ck from the first buffer 20. The input signal conversion detecting unit 30 outputs the selection signal SETUP for selecting the output from the first or second delay unit 26, 28 according to the conversion of the input signal.

The input signal conversion detecting unit 30 includes a NAND gate N5 for respectively NANDing the output signal from the second buffer 24 and an inverted signal thereof; and a latch unit LT for latching the output from the NAND gate N5.

Reference numeral 32 indicates a selecting unit for selectively outputting one of the output signals from the first and second delay units 26, 28 according to the output signal SETUP from the input signal conversion detecting unit 30. A signal i2sig outputted from the selecting unit 32 is a signal compensated for the setup time ts and the hold time th for the input signal.

The selecting unit 32 includes a transmission gate T1 for transmitting the output signal from the first delay unit 26; and a transmission gate T2 for transmitting the output signal from the second delay unit 28. The transmission gates T1, T2 perform a switching operation oppositely from each other.

Reference numeral 34 denotes a switching unit for NANDing the signal int_clk from the internal clock generating unit 22 and the signal i2sig from the selecting unit 32 by using a NAND gate N6, and outputting a resultant signal thereof. The resultant signal is the effective signal of the input signal to be employed in a chip.

A time difference between the reference signal CLK and the input signal inputsig which are inputted to the switching unit 34 is different from a time difference between the two signals when they are processed in the chip and inputted to the input terminal of the switching unit 34.

The operation of the input buffer in accordance with the preferred embodiment of the present invention will now be explained with reference to the timing diagram of FIG. 5.

Firstly, the operation of the input buffer in a state where a long delay time is required for the hold time th will now be explained with reference to FIG. 5a.

The clock signal CLK which becomes a reference signal has a constant period and repeats high and low states.

When the clock signal CLK is inputted to the first buffer 20, if the input signal inputsig inputted to the second buffer 24 is converted at a high portion of the clock signal CLK, the hold time th is very important in the input signal inputsig. In the case that the input signal inputsig is converted at a high portion of the clock signal CLK, the hold time th of the signal is inferior, as compared with the rise edge of the reference signal CLK. Accordingly, a long delay path must be selected to compensate for the hold time.

Figure 5A:
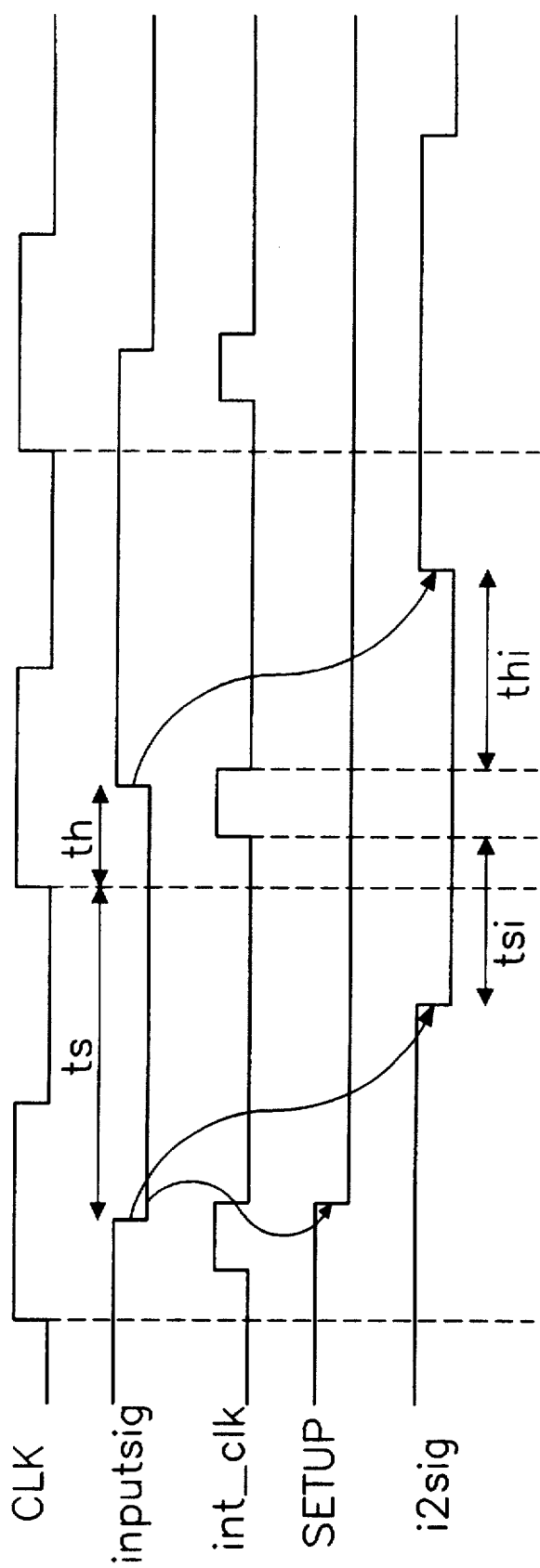
FIGS. 5a and 5b are operational timing diagrams of the input buffer in accordance with the preferred embodiment of the present invention.

As shown in FIG. 5a, when the clock signal CLK is at a high level, if the level of the input signal inputsig is converted (for example, from high to low), the output from the NAND gate N2 in the input signal conversion detecting unit 30 becomes a high level, the output from the NAND gate N3 becomes a low level, and thus the output from the NAND gate N4 becomes a high level. Accordingly, the NAND gate N5 NANDs the output (high level) from the NAND gate N4 and the high-level clock signal CLK, and outputs the low-level output signal. As a result, the transmission gate T2 of the selecting unit 32 is turned on. In a state where the clock signal CLK is at a high level, if the input signal inputsig is converted from low to high, the output signal outputted from the NAND gate N5 is at a low level.

Thus, the signal i2sig outputted from the selecting unit 32 is a signal delayed by the second delay unit 28 for a longer time.

In the case that the hold time th is insufficient as described above, the longer delay unit 28 is selected to reduce the speed of the intermediate input signal i2sig reaching to the switching unit 34, thereby compensating for the hold time th.

Conversely, the operation of the input buffer in a state where a short delay time is required for the setup time ts will now be explained with reference to FIG. 5b.

The clock signal CLK which becomes a reference signal has a constant period and repeats high and low states.

When the clock signal CLK is inputted to the first buffer 20, if the input signal inputsig inputted to the second buffer 24 is converted at a low portion of the clock signal CLK, the setup time ts is very important in the input signal inputsig. Since the input signal inputsig is inputted later than the reference signal CLK, the input signal inputsig must be processed inside as fast as possible so as to keep the switching time.

Figure 5B:
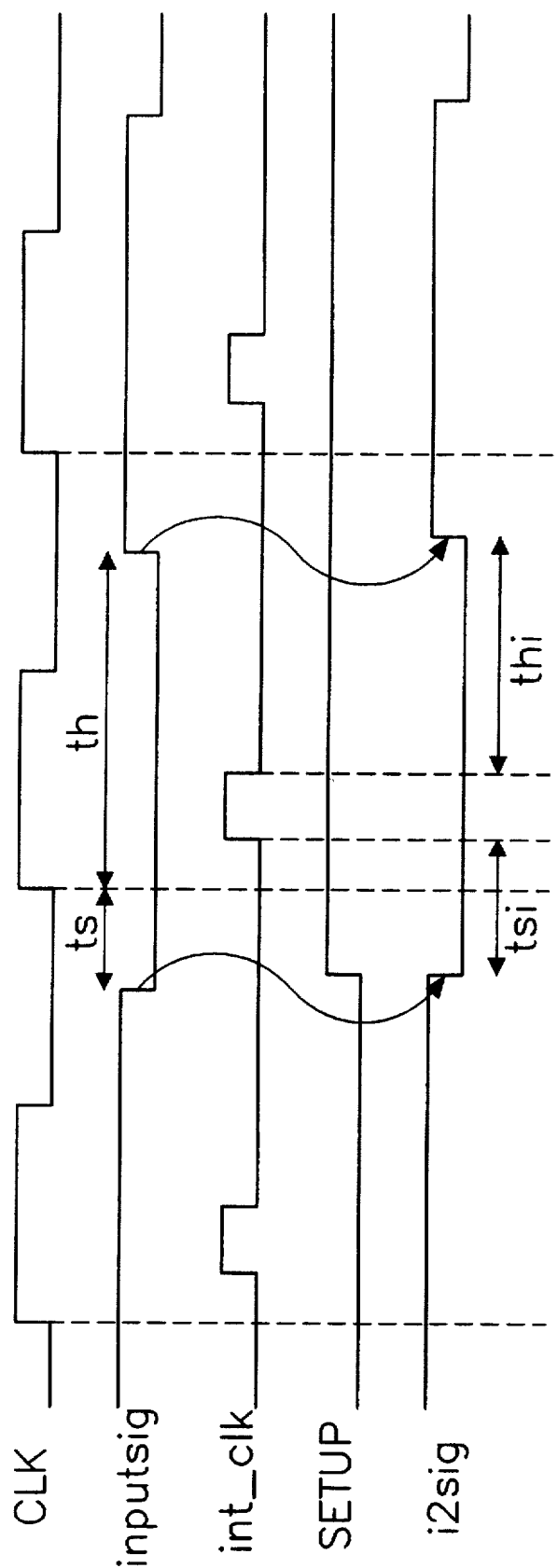

As shown in FIG. 5b, when the clock signal CLK is at a low level, if the level of the input signal inputsig is converted (for example, from high to low), the output from the NAND gate N2 in the input signal conversion detecting unit 30 becomes a high level, the output from the NAND gate N3 becomes a low level, and thus the high-level output signal is outputted by NANDing the output (high level) from the NAND gate N4 and the low-level clock signal CLK. As a result, the transmission gate T1 of the selecting unit 32 is turned on. In a state where the clock signal CLK is at a low level, if the level of the input signal inputsig is converted from low to high, the output signal outputted from the NAND gate N5 is at a high level.

Thus, the signal i2sig outputted from the selecting unit 32 is a signal delayed by the first delay unit 26 for a shorter time.

When the input signal inputsig is not inputted much earlier than the reference signal CLK or when it is inputted later than the reference signal CLK, the input signal inputsig must be processed inside as fast as possible in order to keep the switching time.

Figure 1:
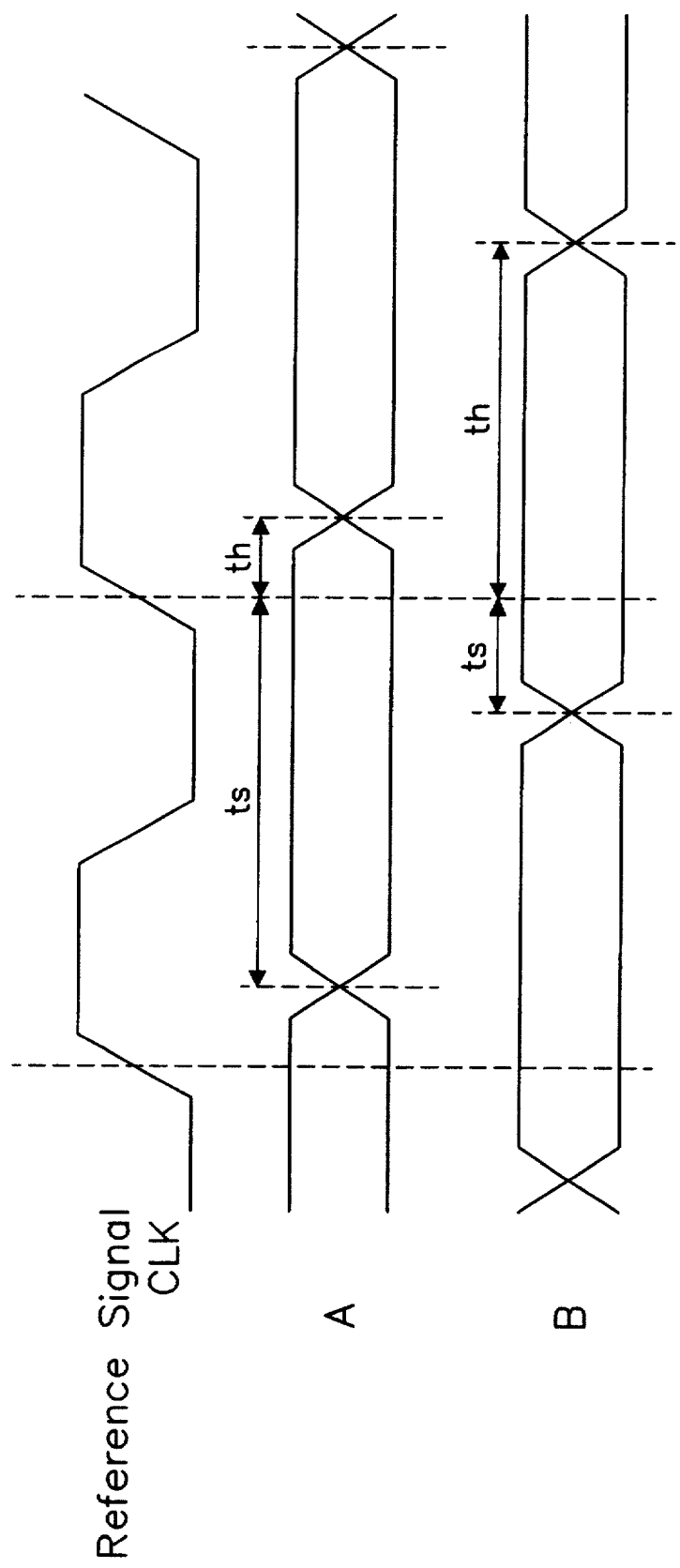
FIG. 1 is a timing diagram for explaining the operational conditions of a general input signal.
Figure 2:
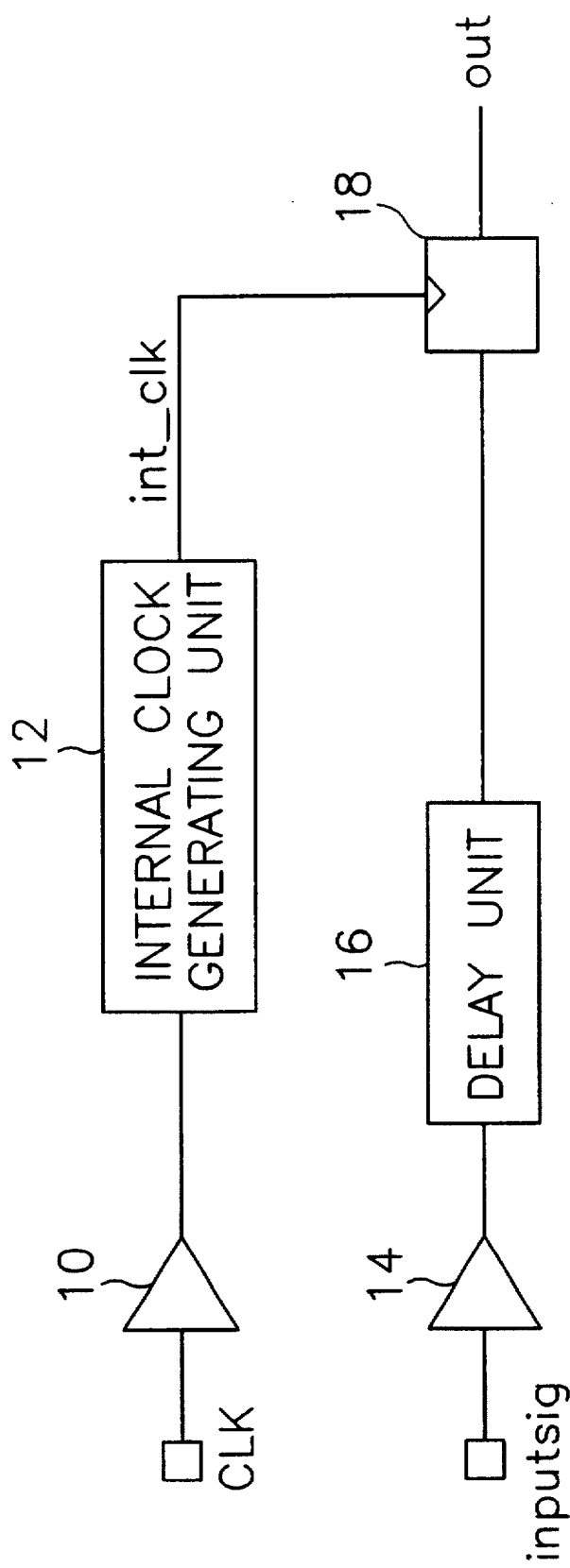
FIG. 2 is a block diagram illustrating a general input buffer.

As depicted in FIGS. 5a and 5b, tsi and thi may be identical, but are mostly different. In addition, the time interval between the hold time th and the setup time ts is considerably increased in the conventional art (refer to FIG. 1), while the time interval is small in the present invention.

In this embodiment, the delay circuit on the input path is divided into two, but may be divided into three or more, if necessary.

As discussed earlier, in accordance with the present invention, when the setup time is important, a path of a short delay time is employed, and when the hold time is important, a path of a long delay time is used. Therefore, the internal setup time/hold time may be suitably selected in the system application conditions.

As a result, since the stable setup/hold time property is provided to the two systems in the contrary input operational conditions, a special product needs not to be developed.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. An input buffer comprising:
   a buffer for receiving an input signal through an input pin;
   a plurality of delay units for delaying the input signal inputted from the buffer by a different delay time;
   an input signal variation detecting unit for detecting a level of an externally-inputted reference signal at a time point in which the input signal from the buffer varies high-to-low or low-to-high, and outputting a setup signal; and
   a selecting unit for selectively outputting one of the output signals from the plurality of delay units in response to the setup signal from the input signal variation detecting unit.

2. The input buffer according to claim 1, wherein the selecting unit selects the output signal from the delay unit having the longest delay time among the plurality of delay units, if the level of the reference signal is at logic high at the time point when the input signal from the buffer varies, and wherein the selecting unit selects the output signal from the delay unit having the shortest delay time among the plurality of delay units, if the level of the reference signal is at logic low at the time point when the input signal from the buffer varies.

3. An input buffer comprising:
   a first buffer for receiving an externally-inputted clock signal as a reference signal;
   a second buffer for receiving an input signal through an input pin;
   a plurality of delay units for delaying the signal inputted from the second buffer by a different time;
   an input signal variation detecting unit for detecting a level of the externally-inputted reference signal at a time point in which the input signal from the buffer varies high-to-low or low-to-high, and outputting a setup signal;
   a selecting unit for selectively outputting one of the output signals from the plurality of delay units in response to the setup signal from the input signal variation detecting unit; and
   a switching unit for receiving a signal from the selecting unit, and outputting an effective signal of input signal.

4. The input buffer according to claim 3, wherein the input signal variation detecting unit comprises:
   a logic circuit unit for respectively NANDing the output signal from the first buffer and the output signal from the second buffer; and
   a latch unit for latching the output from the logic circuit unit.

5. The input buffer according to claim 3, wherein the selecting unit comprises:
   a first transmission gate for transmitting the output signal from one delay unit among the plurality of delay units; and
   a second transmission gate for transmitting the output signal from another delay unit among the plurality of the delay units.

6. The input buffer according to claim 3, wherein the selecting unit selects the output signal from the delay unit having the longest delay time among the plurality of delay units, if the level of the reference signal is at logic high at the time point when the input signal from the second buffer varies, and wherein the selecting unit selects the output signal from the delay unit having the shortest delay time among the plurality of delay units, if the level of the reference signal is at logic low at the time point when the input signal from the second buffer varies.

* * * * *